(12) United States Patent
Ohtsuki et al.

(10) Patent No.: US 8,900,971 B2
(45) Date of Patent: Dec. 2, 2014

(54) BONDED SUBSTRATE AND MANUFACTURING METHOD THEREOF

(75) Inventors: Tsuyoshi Ohtsuki, Annaka (JP); Wei Feng Qu, Annaka (JP); Fumio Tahara, Annaka (JP); Yuuki Ooi, Annaka (JP); Kiyoshi Mitani, Annaka (JP); Kyoko Mitani, legal representative, Takasaki (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 13/978,840

(22) PCT Filed: Jan. 6, 2012

(86) PCT No.: PCT/JP2012/000049
§ 371 (c)(1),
(2), (4) Date: Jul. 9, 2013

(87) PCT Pub. No.: WO2012/108121
PCT Pub. Date: Aug. 16, 2012

(65) Prior Publication Data
US 2013/0341763 A1    Dec. 26, 2013

(30) Foreign Application Priority Data

Feb. 9, 2011    (JP) .................................. 2011-025623

(51) Int. Cl.
| | |
|---|---|
| *H01L 21/30* | (2006.01) |
| *H01L 23/00* | (2006.01) |
| *H01L 21/762* | (2006.01) |
| *H01L 21/84* | (2006.01) |

(52) U.S. Cl.
CPC ................. *H01L 24/83* (2013.01); *H01L 21/84* (2013.01); *H01L 2224/83* (2013.01); *H01L 21/76254* (2013.01); *H01L 21/76256* (2013.01); *H01L 24/26* (2013.01)
USPC ........................................ 438/459; 257/618

(58) Field of Classification Search
CPC .................. H01L 21/76256; H01L 21/76254; H01L 24/83; H01L 24/26
USPC ........................................... 257/618; 438/459
See application file for complete search history.

(56) References Cited

U.S. PATENT DOCUMENTS

| | | | |
|---|---|---|---|
| 6,955,971 B2 * | 10/2005 | Ghyselen et al. ............. | 438/406 |
| 7,422,958 B2 * | 9/2008 | Kostrzewa et al. ........... | 438/406 |

(Continued)

FOREIGN PATENT DOCUMENTS

| | | |
|---|---|---|
| EP | 0 536 790 A2 | 4/1993 |
| JP | A-4-103177 | 4/1992 |

(Continued)

OTHER PUBLICATIONS

Oct. 8, 2013 Office Action issued in Japanese App. No. JP-A-2011-025623 (with partial translation).

(Continued)

*Primary Examiner* — Trung Q Dang
(74) *Attorney, Agent, or Firm* — Oliff PLC (57) ABSTRACT

The invention provides a method for manufacturing a bonded substrate by bonding a base substrate to a bond substrate through an insulator film, including: a porous layer forming step of partially forming a porous layer or forming a porous layer whose thickness partially varies on a bonding surface of the base substrate; an insulator film forming step of changing the porous layer into the insulator film, and thereby forming the insulator film whose thickness partially varies on the bonding surface of the base substrate; a bonding step of bonding the base substrate to the bond substrate through the insulator film; and a film thickness reducing step of reducing a film thickness of the bonded bond substrate to form a thin-film layer. As a result, there is provided the method for manufacturing a bonded substrate that enables obtaining an insulator film whose thickness partially varies with use of a simple method.

15 Claims, 4 Drawing Sheets

(56) References Cited

U.S. PATENT DOCUMENTS

| | | | |
|---|---|---|---|
| 7,781,300 B2* | 8/2010 | Moriceau et al. | 438/405 |
| 7,935,613 B2* | 5/2011 | Gulari | 438/475 |
| 2005/0196934 A1 | 9/2005 | Tazoe et al. | |
| 2007/0202660 A1 | 8/2007 | Moriceau et al. | |
| 2008/0153251 A1 | 6/2008 | Kostrzewa et al. | |
| 2009/0032911 A1* | 2/2009 | Kononchuk | 257/647 |
| 2009/0127624 A1 | 5/2009 | Sumitomo et al. | |

FOREIGN PATENT DOCUMENTS

| | | |
|---|---|---|
| JP | A-11-186566 | 7/1999 |
| JP | A-2005-229062 | 8/2005 |
| JP | A-2006-100479 | 4/2006 |
| JP | A-2008-516443 | 5/2008 |
| JP | A-2009-147297 | 7/2009 |
| WO | WO 2005/062364 A1 | 7/2005 |

OTHER PUBLICATIONS

Aug. 13, 2013 International Preliminary Report on Patentability issued in International App. No. PCT/JP2012/000049.

Sakaguchi, et al., "Current Progress in Epitaxial Layer Transfer (ELTRAN)," *Ieice Trans. Electron*, vol. E80-C, No. 3, Mar. 1997, pp. 378-387.

Feb. 7, 2012 International Search Report issued in International Patent Application No. PCT/JP2012/000049.

Jul. 11, 2011 Supplementary European Search Report issued in European Application No. EP 12747234.1.

\* cited by examiner

BONDED SUBSTRATE AND MANUFACTURING METHOD THEREOF

TECHNICAL FIELD

The present invention relates to a bonded substrate and a manufacturing method thereof.

BACKGROUND ART

In recent years, attention has been paid to a silicon device which is fabricated by integrating on the same substrate various kinds of sensors used for measuring inertia force, a pressure, and other various physical quantities, which are induced by, e.g., acceleration or angular velocity, a fluid sensor having a flow channel provided on a silicon substrate, and a power device that handles a high voltage or a high current.

Such a sensor has, e.g., a cantilever beam or a hollow structural mass body fabricated on a silicon substrate by MEMS (Micro Electro Mechanical System) technology or a hollow structure fabricated in the silicon substrate. As an example of a method for fabricating such a sensor on a substrate, a method using an SOI substrate has been reported (Patent Literature 1). In Patent Literature 1, an SOI wafer having an insulator film on a base substrate and a thin-film layer on the insulator film is prepared, and a bridge resistive element serving as a sensor unit, a control unit (a CMOS circuit), and a wiring unit are fabricated on a thin-film layer surface of the SOI wafer. Then, a front side and a back side of the SOI wafer are covered with a protective material (a resist), a window is formed in a back side portion corresponding to the sensor unit by photolithography, and then a back side silicon portion corresponding to the sensor unit is formed into a thin film by etching. Then, this product is attached to a glass substrate, and a pressure sensor is brought to completion. Further, as a method for fabricating a high-voltage/high-current power device on a substrate, a method for separately arranging a portion to which a high voltage is applied and any other portion on respective device regions has been introduced (Patent Literature 2).

CITATION LIST

Patent Literatures

Patent Literature 1: Japanese Unexamined Patent Application Publication No. H4-103177
Patent Literature 2: Japanese Unexamined Patent Application Publication No. 2009-147297
Patent Literature 3: Japanese Unexamined Patent Application Publication No. 2005-229062
Patent Literature 4: Japanese Unexamined Patent Application Publication No. 2006-100479

Non-Patent Literature

Non-patent Literature 1: "IEICE Transactions on Electron", Vol. 80-C, No. 3 (1997) pp. 378-387

DISCLOSURE OF INVENTION

Problem to be Solved by the Invention

Fundamentally, a necessary thickness of an insulator film varies depending on types of, e.g., a sensor device, a high-voltage/high-current power device, and a control unit (a CMOS circuit or the like) formed on a thin-film layer. However, it is difficult to fabricate a bonded substrate having an insulator film with a film thickness that appropriately partially varies, and a general method for manufacturing a bonded substrate just enables fabricating a bonded substrate having an insulator film that is uniform in a substrate. Therefore, the insulator film of the bonded substrate is determined based on a portion that requires the largest film thickness, e.g., a portion requiring the highest breakdown voltage in a circuit. However, when a thickness of the insulator film is uniform and large, at the time of integrating and fabricating devices requiring different breakdown voltage characteristics, e.g., a sensor device, a high-voltage/high-current power device, a control unit (a CMOS circuit or the like), a fabrication process becomes complicated, and a problem lies in that functions of the respective devices are limited. Therefore, there has been demanded development of a method for manufacturing a bonded substrate that enables forming an insulator film whose thickness partially varies by a simple method and a bonded substrate whose thickness partially varies.

In view of the above-described problem, it is an object of the present invention to provide a method for manufacturing a bonded substrate that enables forming an insulator film whose thickness partially varies by a simple method. Further, another object is to provide a bonded substrate at the time of integrating and fabricating devices requiring different breakdown voltage characteristics, e.g., a sensor device, a high-voltage/high-current power device, a control unit (a CMOS circuit or the like), and others, these devices can be formed at respective insulator film portions having optimum film thicknesses, thereby enables fabricating each sophisticated element while reducing the number of fabricating steps.

Means for Solving Problem

To achieve this object, according to the present invention, there is provided a method for manufacturing a bonded substrate by bonding a base substrate to a bond substrate through an insulator film, including at least:

a porous layer forming step of partially forming a porous layer or forming a porous layer whose thickness partially varies on a bonding surface of the base substrate;

an insulator film forming step of changing the porous layer into the insulator film, and thereby forming the insulator film whose thickness partially varies on the bonding surface of the base substrate;

a bonding step of bonding the base substrate to the bond substrate through the insulator film; and a film thickness reducing step of reducing a film thickness of the bonded bond substrate to form a thin-film layer.

According to such a method for manufacturing a bonded substrate having the porous layer forming step and the insulator film forming step, there can be provided a method for manufacturing a bonded substrate that uses a difference in insulator film formation rate between the portion where the porous layer is formed and the portion where the porous layer is not formed in the base substrate, thereby easily forming the insulator film whose thickness partially varies. Furthermore, in the thus manufactured bonded substrate, at the time of integrating and fabricating the devices requiring different breakdown voltage characteristics, e.g., a sensor device, a high-voltage/high-current power device, a control unit (a CMOS circuit or the like), these devices can be formed at the respective insulator film portions having the optimum film thicknesses, thus providing the bonded substrate that enables fabricating the sophisticated devices while reducing the fabrication steps.

Moreover, at the porous layer forming step, in case of forming the porous layer whose thickness partially varies on the bonding surface of the base substrate, at least, it is preferable that a protective film is formed on the bonding surface of the base substrate, a resist mask is formed on the protective film, the protective film is subjected to pattern forming in accordance with a shape of the resist mask, the resist mask is removed, the porous layer is formed on the bonding surface of the base substrate having the protective film subjected to the pattern forming, and the porous layer whose thickness partially varies is thereby formed on the entire bonding surface of the base substrate.

According to such a porous layer forming step, since the porous layer is deeply formed at the portion where the protective film is not provided and the porous layer is shallowly formed at the portion where the protective film is provided, the porous layer whose thickness partially varies can be easily formed on the entire bonding surface of the base substrate, which is preferable.

Moreover, at the porous layer forming step, in case of partially forming the porous layer on the bonding surface of the base substrate, at least, it is preferable that a resist mask is formed on the bonding surface of the base substrate, the porous layer is formed on the bonding surface of the base substrate, then the resist mask is removed, and the porous layer is thereby partially formed on the bonding surface of the base substrate.

According to such a porous layer forming step, since the porous layer is not formed at the portion where the resist mask is provided, the porous layer can be easily partially formed on the bonding surface of the base substrate, which is preferable.

Additionally, at the porous layer forming step, it is preferable that the bonding surface of the base substrate is subjected to anodic oxidation, and the porous layer is thereby partially formed or the porous layer whose thickness partially varies is thereby formed on the bonding surface of the base substrate.

According to such an anodic oxidation method, the porous layer can be easily formed, and a thickness, porosity, and a pore size of the porous layer can be readily controlled in accordance with a use application of the substrate, which is preferable.

Further, at the porous layer forming step, in case of forming the porous layer whose thickness partially varies on the bonding surface of the base substrate, it is preferable that the bonding surface of the base substrate is subjected to anodic oxidation, and the protective film subjected to the pattern forming is removed.

According to such a porous layer forming step, since the porous layer is deeply formed at the portion where the protective film is not provided and the porous layer is not formed until the portion having the protective film is removed by the anodic oxidation at the portion where the protective film is provided, the porous layer is further shallowly formed, and the porous layer whose thickness partially differs can be easily formed on the entire bonding surface of the base substrate, which is preferable.

Furthermore, it is preferable to use a silicon substrate as the base substrate and/or the bond substrate.

When the silicon substrate is used as the base substrate in this manner, the porous layer can be easily formed at the porous layer forming step, and an oxide film can be easily formed as an insulator film at the insulator film forming step, whish is preferable. Moreover, when the silicon substrate is used as the bond substrate, the thin-film layer formed at the film reducing step becomes a so-called SOI layer, and various kinds of devices, e.g., a sensor device, a high-voltage/high-current power device, and a control unit (a CMOS circuit or the like) can be readily manufactured, which is preferable.

Moreover, when the silicon substrate is used for both the base substrate and the bond substrate, it is possible to provide a method for manufacturing a bonded substrate which can apply conventional steps without complicating a configuration itself and enables manufacture with a good yield ratio at low cost, which is preferable.

Additionally, at the insulator film forming step, it is preferable to form the insulator film, whose thickness is partially varies, on the bonding surface of the base substrate by changing the porous layer into an oxide film by thermal oxidation.

When the oxide film is formed in this manner, the insulator film whose thickness partially varies can be easily formed on the bonding surface of the base substrate, which is preferable. Further, since the oxide film has excellent insulation properties, it is desirable as the insulator film.

Furthermore, to achieve the above-descried object, according to the present invention, there is provided a bonded substrate including: an insulator film on a base substrate; and a thin-film layer on the insulator film, wherein at least a thickness of the insulator film partially varies.

According to such a bonded substrate, at the time of integrating and fabricating devices requiring different breakdown voltage characteristics, e.g., a sensor device, a high-voltage/high-current power device, and a control unit (a CMOS circuit or the like), since these devices can be formed at the insulator film portion having optimum film thicknesses, thereby providing the bonded substrate that enables fabricating sophisticated devices while reducing the fabrication steps.

Moreover, it is preferable for an interface of the insulator film and the thin-film layer to be flat.

Such a bonded substrate can be a bonded substrate that is further suitable for integrating and forming devices requiring different breakdown voltage characteristics, e.g., a sensor device, a high-voltage/high-current power device, and a control unit (a CMOS circuit or the like) fabricated by applying the MEMS technology, which is preferable.

Additionally, it is preferable for the base substrate to be a silicon substrate and/or the thin-film layer to be made of silicon.

Such a base substrate or a thin-film layer (an SOI layer) can provide a bonded substrate that is easy to be handled and further suitable for integrating and forming devices requiring different breakdown voltage characteristics, which is preferable.

Further, it is preferable for the insulator film to be an oxide film.

If the insulator film whose thickness partially varies is the oxide film, there can be provided a bonded substrate that is further suitable for integrating and forming devices requiring different breakdown voltage characteristics, which is preferable.

Effect of Invention

As described above, according to the present invention, there can be provided the method for manufacturing a bonded substrate that enables forming the insulator film whose thickness partially varies with use of a simple method. Furthermore, at the time of integrating and fabricating devices requiring different breakdown voltage characteristics, e.g., a sensor device, a high-voltage/high-current power device, and a control unit (a CMOS circuit or the like) on the same substrate, these devices can be formed at portions of the respective insulator film having optimum film thicknesses, and hence the bonded substrate that enables fabricating sophisticated devices can be provided while reducing fabrication steps.

DESCRIPTION OF EMBODIMENTS

Although embodiments according to the present invention will now be described hereinafter, the present invention is not restricted thereto.

Functions of devices or the like fabricated on the same substrate are roughly separated. For example, a sensor is divided into a sensor unit and a control unit, and a high-voltage/high-current power device is divided into a high-voltage unit and a control unit. Obviously, it can be considered that characteristics required for a substrate vary depending on a type/function of a device to be fabricated. In case of a bonded substrate in particular, a thickness of an insulator film is considered as an important parameter. It is considered that, in case of a sensor, an optimum film thickness of an insulator film required in a sensor unit is different from an optimum film thickness of the insulator film required in a control unit and, in case of a high-voltage/high-current power device, an optimum film thickness of an insulator film required in a high-voltage/high-current unit is essentially different from an optimum film thickness of the insulator film required in the control unit. However, a conventional method for manufacturing a bonded substrate is not a method for easily controlling a film thickness of an insulator film at a predetermined position from a bonded substrate fabrication stage. Thus, as described above, there has been demanded development of a method for manufacturing a bonded substrate that enables forming an insulator film whose thickness partially varies with use of a simple method and a bonded substrate having an insulator film whose thickness partially differs.

The present inventors have repeated a keen examination about a method for manufacturing a bonded substrate that enables forming an insulator film whose thickness partially varies with use of a simple method and a bonded substrate having an insulator film whose thickness partially varies, have discovered that the insulator film can be formed faster in a porous layer than in a non-porous layer, that partially forming the porous layer or forming the porous layer whose thickness partially varies on a bonding surface of a base substrate enables forming portions having different insulator film formation rates on the same substrate surface, and that changing the porous layer into an insulator film enables forming the insulator film whose thickness partially varies with use of a simple method, thereby bringing the present invention to completion.

Porous silicon itself has been reported in many patent literatures. The usages concern methods for fabricating an SOI wafer, and SOI wafer fabrication methods have been also suggested like Patent Literatures 3 and 4 besides an ELTRAN (a registered trademark) substrate which has been conventionally reported like Non-patent Literature 1. A general porous silicon fabrication method is an anodic oxidation method, and it is roughly described as follows. First, a solution containing HF (hydrogen fluoride) is prepared, and a silicon wafer is put into this solution. Further, a direct-current voltage is applied between this wafer and a counter electrode. At this time, a silicon substrate side is determined as an anode. A result (porosity) of porous silicon varies depending on parameters such as HF solution concentration, a substrate resistivity, applied current density, a time, and others. The parameters that affect the porosity have been also introduced in, e.g., Non-patent Literature 1 in detail.

In regard to an SOI using the thus fabricated porous silicon, there have been known ELTRAN: a method for performing epitaxial growth on a porous silicon layer, bonding it to a wafer having an oxide film, and effecting delamination at a porous layer (Non-patent Literature 1), a method for performing annealing in an oxidizing atmosphere after epitaxial growth on a porous layer, oxidizing the porous layer, and changing this layer into a BOX layer (a buried oxide film layer) (internal oxidation of the porous layer: Patent Literature 3), a method for single-crystallizing a surface based on migration, and changing an inner portion having high porosity into a BOX layer by gradually reducing porosity to form porous silicon and then performing annealing (Patent Literature 4), and others. However, in all the methods, the BOX layer has a uniform thickness, and an insulator film whose film thickness partially varies cannot be formed. Since the bonded substrate according to the present invention has an insulator film whose film thickness partially varies and devices requiring different breakdown voltage characteristics can be formed at portions of the insulator film having different film thicknesses, the present invention has been attained by discovering that the bonded substrate that enables fabrication of sophisticated devices while reducing the number of fabrication steps can be provided. The present invention will now be described hereinafter in detail.

[Bonded Substrate]

That is, according to the present invention, there is provided a bonded substrate which comprises: an insulator film on a base substrate; and a thin-film layer on the insulator film, and it is characterized in that at least a thickness of the insulator film partially varies.

Figure 1:
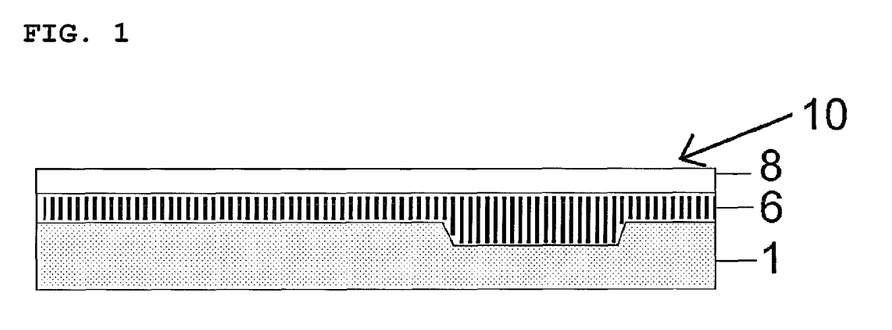
FIG. 1 is a cross-sectional view of a bonded substrate according to the present invention.

FIG. 1 shows a cross-sectional view of the bonded substrate according to the present invention. A bonded substrate 10 according to the present invention has an insulator film 6 on a base substrate 1 and a thin-film layer 8 on the insulator 6, and it is characterized in that a thickness of the insulator film 6 partially varies in particular. Although the bonded substrate according to the present invention is not restricted in particular, it can be an SOI substrate (Silicon On Insulator). Each constituent element of the bonded substrate according to the present invention will now be described hereinafter in detail.

[Base Substrate]

Although the base substrate according to the present invention is not restricted in particular, it is preferably a silicon substrate, especially a silicon single crystal substrate. If the base substrate is a silicon substrate, especially a silicon single crystal substrate, it can be easily handled. Further, as described below, porous silicon can be readily formed as a porous layer, which is preferable. Any other semiconductor substrate of a compound semiconductor or a quarts substrate can be also used as a matter of course.

[Insulator Film]

The bonded substrate according to the present invention has the insulator film on the base substrate, and a thickness of the insulator film partially varies. Although not restricted in particular, the insulator film is preferably a silicon oxide film. If the insulator film is a silicon oxide film, it has excellent breakdown voltage characteristics, and control over its film thickness is easy, which is preferable.

Furthermore, it is preferable for an interface of the insulator film and the thin-film layer to be flat. In case of such a bonded substrate, a thickness of the thin-film layer can be readily uniformed, and devices requiring different breakdown voltage characteristics can be easily integrated and formed on the same substrate, which is preferable.

[Thin-film Layer]

The bonded substrate according to the present invention has the thin-film layer on the insulator film. Although the thin-film layer is not restricted in particular, a thin-film layer made of silicon, especially silicon single crystal, i.e., an SOI layer is preferable. If the thin-film layer is made of silicon, it is easy to handle, and a bonded substrate that is quite suitable for integrating and forming devices requiring different breakdown voltages characteristics on the same substrate can be provided, which is preferable. It is needless to say that the thin-film layer may be made of any other semiconductor, e.g., a compound semiconductor.

According to a conventional method for manufacturing a bonded substrate, since only a bonded substrate having a uniform insulator film in a substrate can be fabricated, a process becomes complicated in integration and fabrication of devices requiring different breakdown voltage characteristics, and low functionality of devices is a problem. However, according to such a bonded substrate of the present invention, in case of integrating and fabricating devices requiring different breakdown voltage characteristics, e.g., a sensor device, a high-voltage/high-current power device, and a control unit (a CMOS circuit or the like), these devices can be formed at portions of the respective insulator film having appropriate film thicknesses, and hence it is possible to provide the bonded substrate that enables fabricating sophisticated devices while reducing fabrication steps.

[Method for Manufacturing Bonded Substrate]

Moreover, the present invention provides a method for manufacturing a bonded substrate by bonding a base substrate to a bond substrate through an insulator film, including at least:

a porous layer forming step of partially forming a porous layer or forming a porous layer whose thickness partially varies on a bonding surface of the base substrate;

an insulator film forming step of changing the porous layer into the insulator film, and thereby forming the insulator film whose thickness partially varies on the bonding surface of the base substrate;

a bonding step of bonding the base substrate to the bond substrate through the insulator film; and a film thickness reducing step of reducing a film thickness of the bonded bond substrate to form a thin-film layer.

Figure 2:
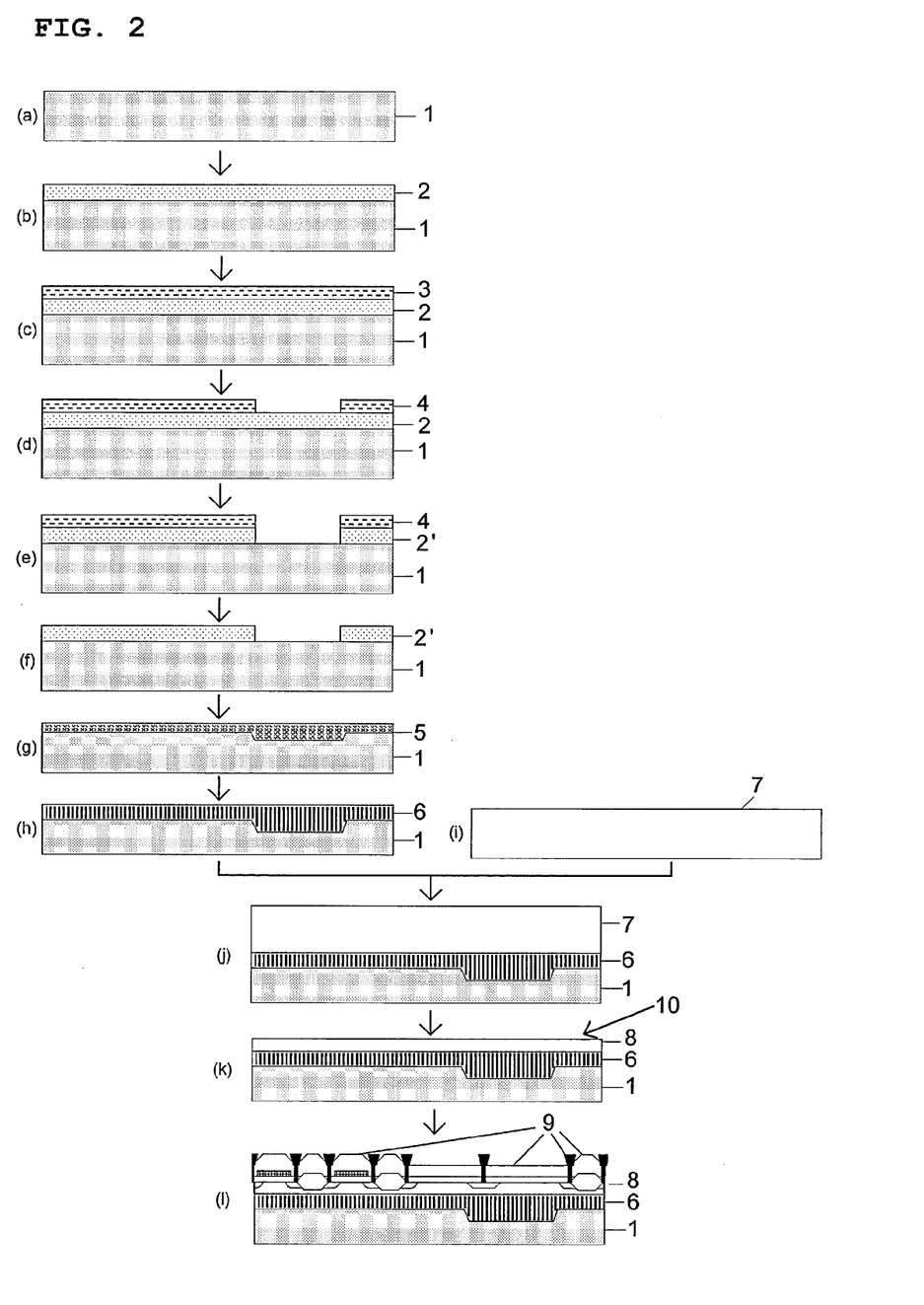
FIG. 2 is a flowchart of a first embodiment of a process for manufacturing a bonded substrate according to the present invention, showing a step of forming devices on the bonded substrate.
Figure 3:
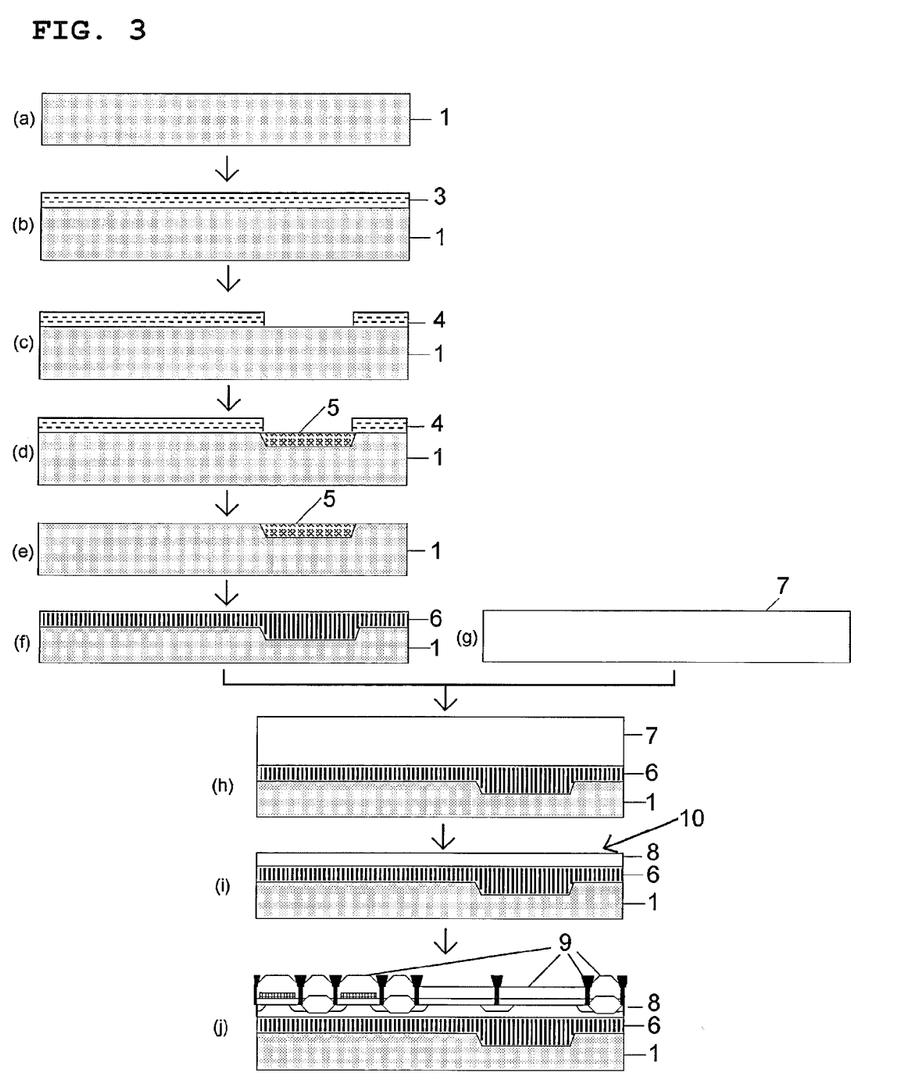
FIG. 3 is a flowchart of a second embodiment of a process for manufacturing a bonded substrate according to the present invention, showing a step of forming devices on the bonded substrate.

Embodiments of the method for manufacturing a bonded substrate according to the present invention will now be described hereinafter with reference to FIG. 2 and FIG. 3. FIG. 2 and FIG. 3 are flowcharts showing a first embodiment and a second embodiment of a process for manufacturing a bonded substrate according to the present invention.

[Porous Layer Forming Step]

At a porous layer forming step according to the present invention, a porous layer 5 is partially formed or a porous layer 5 whose thickness partially varies is formed on a bonding surface of the base substrate 1 (FIG. 2(a) to (g), FIG. 3(a) to (e)). When this porous layer forming step is effected, since a difference in insulator film formation rate between a portion where the porous layer is formed and a portion where no porous layer is formed in the base substrate can be used, the insulator film whose thickness partially varies can be formed at a later-described insulator film forming step. Although illustrative examples of the first and second embodiments of the porous layer forming step will be described below, the porous layer forming step according to the present invention is not restricted thereto.

As the first embodiment of the porous layer forming step, in case of forming the porous layer whose thickness partially varies on the bonding surface of the base substrate, at least, a protective film 2 is formed on the bonding surface of the base substrate 1, a resist mask 4 is formed on the protective film 2, the protective film 2 is subjected to pattern forming in accordance with a shape of the resist mask 4, the resist mask 4 is removed, the porous layer 5 is formed on the bonding surface of the base substrate 1 having the protective film 2' subjected to the pattern forming, and the porous layer 5 whose thickness partially varies can be thereby formed on the entire bonding surface of the base substrate 1 (see FIGS. 2(a) to (g)).

According to such a porous layer forming step, since the porous layer is deeply formed at a portion where no protective film is provided and the porous layer is shallowly formed at a portion where the protective film is provided, the porous layer whose thickness partially varies can be easily formed on the entire bonding surface of the base substrate, which is preferable. A description will now be given with reference to FIG. 2.

As shown in FIG. 2, first, a protective film 2 is formed on the prepared base substrate 1 (FIGS. 2(a) and (b)). Although a film thickness of this protective film concerns a film thickness of the insulator film 6 at the time of fabricating the bonded substrate 10, a specific thickness is also determined in association with conditions of a method for forming the porous layer 5, e.g., a later-described anodic oxidation method. That is, in case of forming the porous layer 5 by the anodic oxidation method, since a rate of etching the protective film 2 differs depending on such conditions, especially HF concentration, the film thickness of the protective film 2 greatly depends on later anodic oxidation conditions. At this time, it is preferable for the protective film 2 to be an oxide film.

Then, a resist film 3 is applied to the protective film 2 (FIG. 2(c)), and a resist mask 4 is formed by photolithography (FIG. 2(d)). Subsequently, the protective film 2 is subjected to pattern forming in accordance with a shape of the resist mask 4 by etching or the like, a protective film 2° subjected to the pattern forming is provided (FIG. 2(e)), and the resist mask 4 is removed (FIG. 2(f)). In this case, a pattern of the resist mask 4 formed in FIG. 2(d) is associated with a portion at which the thickness of the insulator film 6 is to be changed. Since the protective film 2' subjected to the pattern forming functions so as to obstruct formation of a porous layer 5, the porous layer 5 is shallowly formed at a portion covered with the protective film 2' subjected to the pattern forming, and the porous layer 5 is deeply formed at a portion that is not covered with the same. Therefore, after the insulator film forming step, the portion that is covered with the protective film 2' subjected to the pattern forming becomes a portion where the insulator film 6 is thin, and the portion that is not covered with the protective film 2' subjected to the pattern forming becomes a portion where the insulator film 6 is thick.

Then, the porous layer 5 is formed on the bonding surface of the base substrate 1 having the protective film 2' subjected to the pattern forming (FIG. 2(g)). When the porous layer 5 is formed on the base substrate 1 having the protective film 2' subjected to the pattern forming in this manner, formation of the porous layer 5 is delayed at the portion that is covered with the protective film 2' subjected to the pattern forming as compared with the portion that is not covered with the same, and the porous layer 5 whose thickness partially varies is eventually formed. In particular, when a method for advancing the formation of the porous layer 5 toward the inside of the substrate, e.g., a later-descried anodic oxidation method is adopted, the base substrate 1 having no step on its surface, namely, having a flat surface can be obtained. As described above, if the bonding surface of the base substrate 1 after forming the porous layer 5 is flat, bonding is easy, which is preferable.

Additionally, as the second embodiment of the porous layer forming step, in case of partially forming the porous layer on the bonding surface of the base substrate, at least, it is preferable to form a resist mask 4 on the bonding surface of the base substrate 1, form the porous layer 5 on the bonding surface of the base substrate 1, then remove the resist mask 4, and thereby partially form the porous layer 5 on the bonding surface of the base substrate 1 (see FIGS. 3(a) to (e)).

If such a porous layer forming step is adopted, partially forming the porous layer on the bonding surface of the base substrate is easy, which is preferable. This will now be described hereinafter with reference to FIG. 3.

As shown in FIG. 3, first, a resist film 3 is applied to a prepared base substrate 1 (FIGS. 3(a) and (b)), and the resist mask 4 is formed by photolithography (FIG. 3(c)). This pattern is associated with a portion where a film thickness of an insulator film 6 is to be increased. In this case, after the insulator film forming step, a portion that is covered with the resist mask 4 becomes a portion where the insulator film 6 is thin, and a portion that is not covered with the resist mask 4 becomes a portion where the insulator film 6 is thick.

Thereafter, a porous layer 5 is formed on a bonding surface of the base substrate 1 having the resist mask 4 (FIG. 3(d)), and the resist mask 4 is removed (FIG. 3(e)). When the porous layer 5 is formed with respect to the base substrate 1 having the resist mask 4 in this manner, formation of the porous layer 5 does not proceed at the portion that is covered with the resist mask 4, and hence the porous layer 5 can be partially formed on the bonding surface of the base substrate 1. In particular, when a method for advancing the formation of the porous layer 5 toward the inside of the substrate, e.g., the later-described anodic oxidation method is adopted, the base substrate 1 having no step on its surface, namely, having a flat surface can be obtained. As described above, if the bonding surface of the base substrate 1 after forming the porous layer 5 is flat, bonding is easy, which is preferable.

Further, at the porous layer forming step according to each of the first and second embodiments, it is preferable to perform anodic oxidation to the bonding surface of the base substrate so that the porous layer is partially formed or the porous layer whose thickness partially varies can be formed on the bonding surface of the base substrate. According to such an anodic oxidation method, the porous layer can be easily formed, and a thickness, porosity, and a pore size of the porous layer can be readily controlled in accordance with each use application of the substrate, which is preferable. The method using this anodic oxidation method will now be described hereinafter.

For example, when the base substrate 1 such as a silicon single crystal substrate is determined as an anode in an anodizing liquid such as a liquid containing HF (hydrogen fluoride) and a current is allowed to flow, the porous layer 5 (a porous body) having fine holes each having a diameter of several nm is formed on a surface of the base substrate 1 (see FIG. 2(g) and FIG. 3(d)). Here, when a composition or ion concentration of the anodizing liquid, e.g., the HF containing liquid and a current value are changed, porosity, a thickness, a pore size, and others of the porous layer 5 can be adjusted. For example, when HF concentration is 30% and a current application times is eight seconds, the thickness of the porous layer 5 can be approximately 200 nm, and the porosity of the same can be approximately 40%. The porosity, the thickness, the pore size, and others of the porous layer 5 which are dependent on conditions of this anodic oxidation method can be determined while considering a required film thickness of the insulator film and others.

Furthermore, at the porous layer forming step, in case of forming the porous layer 5 whose thickness partially varies on the bonding surface of the base substrate 1 (see FIGS. 2(a) to (g)), it is preferable to anodize the bonding surface of the base substrate 1 and remove the protective film 2' subjected to the pattern forming. In this case, the porous layer 5 is deeply formed at the portion that is not covered with the protective film 2' subjected to the pattern forming, and the formed porous layer 5 is shallow at the portion that is covered with the protective film 2' subjected to the pattern forming since the porous layer 5 is not formed until the protective film 2' is removed by the anodic oxidation. Therefore, the porous layer 5 whose thickness partially varies can be easily formed on the entire bonding surface of the base substrate 1.

It is to be noted that the porous layer 5 may be formed by any other method than the anodic oxidation method. For example, when the base substrate 1 is subjected to dry etching or wet etching through a mask having many fine openings, the porous layer 5 can be likewise formed.

Furthermore, as the base substrate 1 and/or a bond substrate 7 prepared in FIGS. 2(a) and (i) and FIGS. 3(a) and (g), using a silicon substrate, especially a silicon single crystal substrate is desirable. When the silicon substrate is used as the base substrate 1 in this manner, forming the porous layer 5 is facilitated at the porous layer forming step, and forming the porous silicon as the porous layer 5 is facilitated by the anodic oxidation method, which is preferable. Moreover, at the later-described insulator film forming step, forming the insulator film 6 on the base substrate 1 is facilitated, which is preferable. Additionally, when the silicon substrate is used as the bond substrate 7, the thin-film layer 8 formed at a film thickness reducing step becomes a so-called SOI layer, and it can be applied to manufacture of various kinds of devices such as a sensor device, a high-voltage/high-current power device, and a control unit (a CMOS circuit or the like), which is preferable. Further, when the silicon substrate is used as both the base substrate 1 and the bond substrate 7, a configuration itself does not become complicated, the conventional process can be applied, and the method for manufacturing a bonded substrate at low cost with a good yield ratio can be realized, which is preferable.

[Insulator Film Forming Step]

At the insulator film forming step according to the present invention, changing the porous layer 5 into the insulator film 6 enables forming the insulator film 6, whose thickness partially varies, on the bonding surface of the base substrate 1 (FIG. 2(h), FIG. 3(f)). In this case, at the insulator film forming step, it is preferable to form the insulator film 6, whose thickness partially varies, on the bonding surface of the base substrate by changing the porous layer 5 into an oxide film based on thermal oxidation. As described above, when the oxide film is formed, the insulator film 6 whose thickness partially varies can be easily formed on the bonding surface of the base substrate 1, which is preferable. Oxidation conditions and an oxidizing method for this occasion are appropriately determined based on, e.g., a necessary film thickness of the insulator film 6 when a bonded substrate 10 is provided.

The present inventors have discovered that the porous layer 5 has a higher rate of forming the insulator film 6 than a surface of the regular base substrate 1. For example, when a silicon single crystal substrate is used as the base substrate 1, an oxidation rate of a porous silicon layer as the porous layer 5 is approximately 1.5-fold of that of the silicon single crystal substrate. Based on this difference in formation rate, the porous layer 5 can be selectively quickly formed, and the insulator film 6 can be formed. As a result, an oxide film as the insulator film 6 associated with a thickness of the porous layer 5 can be formed. In regard to oxidizing conditions in this occasion, for the purpose of a pressure sensor use or a power device use, it can be expected that an oxide film which is as relatively thick as approximately 1 μm is required. Therefore, although not restricted in particular, a method effected at a high temperature of, e.g., 1100° C. with a high oxidation rate of steam oxidation or the like is preferred. It is to be noted that, at the insulator film forming step, the insulator film 6 can be formed on bonding surfaces of both the base substrate 1 and the bond substrate 7.

[Bonding Step]

At a bonding step according to the present invention, the base substrate 1 is bonded to the bond substrate 7 through the insulator film 6 (FIG. 2(j), FIG. 3(h)). Further, at the bonding step according to the present invention, to raise bonding strength after bonding, a bonding heat treatment can be carried out. Conditions of this bonding step are not restricted in particular, and any kinds of conditions for fabricating a regular bonded substrate can be applied.

[Film Thickness Reducing Step]

At a film thickness reducing step according to the present invention, after the bonding step, a film thickness of the bond substrate 7 subjected to the bonding is reduced, and the thin-film layer 8 is formed (FIG. 2(k), FIG. 3(i)). As a film thickness reducing method in this case, it is possible to adopt a method using etching or polishing or a method for implanting hydrogen ions into the bond substrate 7 to form an ion-implanted layer before bonding, then performing a heat treatment, delaminating at the ion-implanted layer, and reducing a film thickness.

After the film thickness reducing step, to reform the surface of the thin-film layer 8, it is possible to perform a heat treatment, final polishing, or epitaxial growth. As processing, e.g., surface reforming, a treatment suitable for the surface quality required for fabrication of, e.g., a sensor device, a high-voltage/high-current power device, and a control unit (a CMOS circuit or the like) can be appropriately selected. In this manner, the bonded substrate 10 having the insulator film 6 according to the present invention can be manufactured.

Since forming the insulator film having different film thicknesses is difficult in the conventional examples, a fabrication process becomes complicated in integration and formation of devices requiring different breakdown voltage characteristics, and a problem lies in that functions of the devices are limited since appropriate insulator film thicknesses cannot be selected. However, as described above, according to the method for manufacturing a bonded substrate of the present invention, an insulator film having different thicknesses can be formed in a bonded substrate surface by a simple method. An example of a process for fabricating devices requiring different breakdown voltage characteristics on a bonded substrate manufactured according to the present invention will now be explained hereinafter.

[Process of Fabricating Devices Requiring Different Breakdown Voltage Characteristics]

According to the present invention, after the film thickness reducing step, it is possible to carry out a step of forming devices 9, e.g., a sensor device, a high-voltage/high-current power device, a control unit (a CMOS circuit), and others on the thin-film layer 8 of the manufactured bonded substrate 10 (FIG. 2(1), FIG. 3(j)). In the thus fabricated bonded substrate, the insulator film 6 having film thicknesses associated with the devices requiring different breakdown voltage characteristics are precisely patterned and formed. Therefore, the highly-functional devices 9, e.g., a sensor device, a high-voltage/high-current power device, a control unit (a CMOS circuit or the like), and others can be created with a fewer number of fabrication steps (FIGS. 2(k) to (l), FIGS. 3(i) to (j)).

EXAMPLES

The present invention will now be more specifically explained hereinafter with reference to examples and a comparative example, but the present invention is not restricted to the following examples.

Example 1

Figure 4:
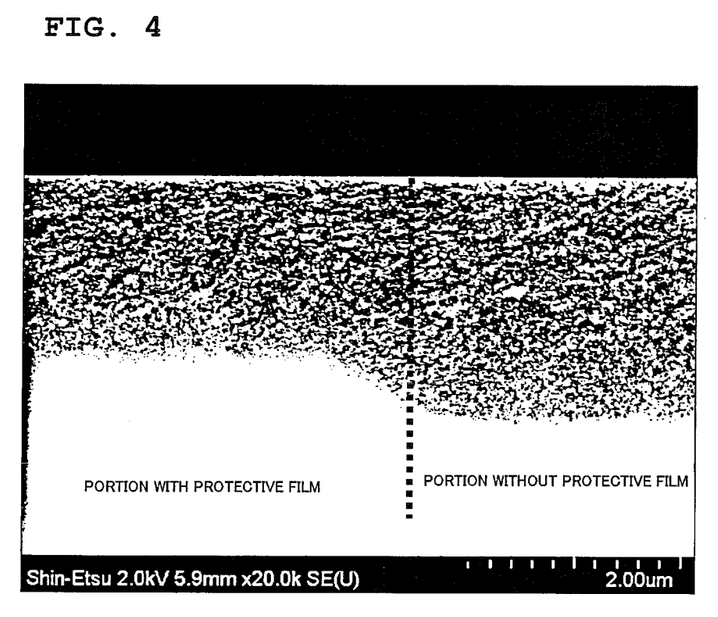
FIG. 4 is a cross-sectional photograph of a base substrate having an insulator film formed thereon in the first embodiment of the process for manufacturing a bonded substrate according to the present invention.

A boron-doped silicon single crystal substrate having a resistivity of 0.05 Ω·cm and a diameter of 150 mm was used as a base substrate, a treatment was carried out with respect to this base substrate in a Pyro atmosphere at 1000° C. for 90 minutes, and an oxide film of 200 nm was formed as a protective film. Then, a resist was applied, and a resist mask was formed by photolithography. In this example, a negative resist was selected. As a portion where an insulator film is thick when a bonded substrate is provided, an opening portion of a 1 mm square was determined. The protective film of this wafer having the resist mask was etched with use of a buffered HF solution, the resist was removed by using a sulfuric acid hydrogen peroxide mixture, then RCA cleaning was effected, and the protective film was subjected to pattern forming in accordance with a shape of the resist mask. Anodic oxidation was carried out with respect to this base substrate with HF concentration of 25% and a current application time of 500 seconds, and a porous layer having a thickness of approximately 1000 nm and porosity of approximately 40% was formed. At a portion where the protective film is provided, the porous layer is not formed until this protective film is etched by the HF solution. As a result, the porous layer whose thickness partially varies was formed on a bonding surface of the base substrate. After the anodic oxidation, a treatment was performed with respect to the base substrate in a Pyro atmosphere at 1150° C. for six hours, the porous layer was changed into an oxide film by thermal oxidation, and an insulator film whose thickness partially varies was formed on the bonding surface of the base substrate. In this case, a layer obtained by oxidizing the porous layer having no protective film was turned to an oxide film of 1 μm, and a portion having the protective film was turned to an oxide film of 0.6 μm. FIG. 4 shows a cross-sectional photograph of the base substrate having the insulator film formed thereon. As shown in FIG. 4, it was revealed that the insulator film whose thickness partially varies was formed on the bonding surface of the base substrate.

A boron-doped silicon single crystal substrate having a resistivity of 0.05 Ω·cm and a diameter of 150 mm as a bond substrate was bonded to this base substrate, and a bonding heat treatment was carried out at 1150° C. Then, a film thickness of the bond substrate was reduced by polishing, and a thin-film layer having a silicon layer thickness of 20 μm was formed, thereby fabricating the bonded substrate according to the present invention.

Example 2

A boron-doped silicon single crystal substrate having a resistivity of 0.05 Ω·cm and a diameter of 150 mm was used as a base substrate, a resist was applied to this base substrate, and a resist mask was formed by photolithography. In this example, a negative resist was selected. As a portion where an insulator film is thick when a bonded substrate is provided, an opening portion of a 1 mm square was determined. Anodic oxidation was performed with respect to a wafer having this resist mask with HF concentration of 25% and a current application time of 500 seconds, and a porous layer having a thickness of approximately 1000 nm and porosity of approximately 40% was formed. Since a portion having the resist mask is not anodized, an anodized portion and a non-anodized portion were formed on the base substrate. As a result, the porous layer was partially formed on a bonding surface of the base substrate. After the anodic oxidation, a treatment was carried out with respect to the base substrate in a Pyro atmosphere at 1150° C. for six hours after removal of the resist mask, the porous layer was changed into an oxide film by thermal oxidation, and an insulator film whose thickness partially varies was thereby formed on the bonding surface of the base substrate. In this case, a layer obtained by oxidizing a portion having the porous layer formed thereat was turned to an oxide film of 1 μm, and a portion having the resist mask (a non-porous layer) was turned to an oxide film of 0.6 μm. Confirming a cross section of the base substrate having the insulator film formed thereon, it was understood that insulator film whose thickness partially varies was formed on the bonding surface of the base substrate like FIG. 4.

A boron-doped silicon single-crystal substrate having a resistivity of 0.05 Ω·cm and a diameter of 150 mm as a bond substrate was bonded to this base substrate, and a bonding heat treatment was carried out at 1150° C. Then, a film thickness of the bond substrate was reduced by polishing, and a thin-film layer having a silicon layer thickness of 20 ||m was formed, thereby fabricating the bonded substrate according to the present invention.

Comparative Example 1

As Comparative Example 1, a conventional method that does not perform the porous layer forming step will now be described. A boron-doped silicon single crystal substrate having a resistivity of 0.05 Ω·cm and a diameter of 150 mm was used as a base substrate, a treatment was carried out with respect to this base substrate in a Pyro atmosphere at 1150° C. for six hours, and an oxide film having a thickness of 600 nm was formed as an insulator film. A boron-doped silicon single crystal substrate having a resistivity of 0.05 Ω·cm and a diameter of 150 mm as a bond substrate was bonded with respect to this base substrate, and a bonding heat treatment was carried out at 1150° C. Thereafter, a film thickness of the bond substrate was reduced by polishing, a thin-film layer having a silicon layer thickness of 20 μm was thereby formed, thus fabricating a bonded substrate. Confirming a cross section of the base substrate having the insulator film formed thereon, it was revealed that the insulator film having a uniform thickness of 0.6 μm was formed on a bonding surface of the base substrate.

From the above, it was confirmed that the bonded substrate having the insulator film whose thickness partially differs cannot be fabricated according to Comparative Example 1 in which a porous layer is not formed. On the other hand, according to the method for manufacturing a bonded substrate of the present invention, it was confirmed that the porous layer is partially formed or the porous layer whose thickness partially varies is formed on the bonding surface of the base substrate, and changing the porous layer into the oxide film by thermal oxidation enables forming the insulator film whose thickness partially varies on the bonding surface of the base substrate.

Furthermore, in the bonded substrate according to the present invention, since the thickness of the insulator film partially varies but a bonding interface is flat, an interface of the insulator film and the thin-film layer is flat. Therefore, the photolithography process can be performed as usual, and devices can be fabricated. Accordingly, devices requiring different breakdown voltage characteristics, e.g., a sensor device, a high-voltage/high-current power device, a control unit (a CMOS circuit or the like), and others can be accurately formed at portions of the respective insulator film having appropriate film thicknesses, and hence the bonded substrate that enables fabricating the sophisticated devices while reducing the fabrication steps can be provided.

It is to be noted that the present invention is not restricted to the foregoing embodiment. The foregoing embodiment is just an illustrative example, and any example that has substantially the same configuration and exercises the same functions and effects as the technical concept described in claims according to the present invention is included in the technical scope of the present invention.

The invention claimed is:

1. A method for manufacturing a bonded substrate by bonding a base substrate to a bond substrate through an insulator film, comprising at least:
   a porous layer forming step of partially forming a porous layer or forming a porous layer whose thickness partially varies on a bonding surface of the base substrate;
   an insulator film forming step of changing the porous layer into the insulator film, and thereby forming the insulator film whose thickness partially varies on the bonding surface of the base substrate;
   a bonding step of bonding the base substrate to the bond substrate through the insulator film; and
   a film thickness reducing step of reducing a film thickness of the bonded bond substrate to form a thin-film layer.

2. The method for manufacturing a bonded substrate according to claim 1,
   wherein, at the porous layer forming step, in case of forming the porous layer whose thickness partially varies on the bonding surface of the base substrate, at least,
   a protective film is formed on the bonding surface of the base substrate, a resist mask is formed on the protective film, the protective film is subjected to pattern forming in accordance with a shape of the resist mask, the resist mask is removed, the porous layer is formed on the bonding surface of the base substrate having the protective film subjected to the pattern forming, and the porous layer whose thickness partially varies is thereby formed on the entire bonding surface of the base substrate.

3. The method for manufacturing a bonded substrate according to claim 1,
wherein, at the porous layer forming step, in case of partially forming the porous layer on the bonding surface of the base substrate, at least,
a resist mask is formed on the bonding surface of the base substrate, the porous layer is formed on the bonding surface of the base substrate, then the resist mask is removed, and the porous layer is thereby partially formed on the bonding surface of the base substrate.

4. The method for manufacturing a bonded substrate according to claim 1,
wherein, at the porous layer forming step, the bonding surface of the base substrate is subjected to anodic oxidation, and the porous layer is thereby partially formed or the porous layer whose thickness partially varies is thereby formed on the bonding surface of the base substrate.

5. The method for manufacturing a bonded substrate according to claim 2,
wherein, at the porous layer forming step, the bonding surface of the base substrate is subjected to anodic oxidation, and the porous layer is thereby partially formed or the porous layer whose thickness partially varies is thereby formed on the bonding surface of the base substrate.

6. The method for manufacturing a bonded substrate according to claim 3,
wherein, at the porous layer forming step, the bonding surface of the base substrate is subjected to anodic oxidation, and the porous layer is thereby partially formed or the porous layer whose thickness partially varies is thereby formed on the bonding surface of the base substrate.

7. The method for manufacturing a bonded substrate according to claim 2,
wherein, at the porous layer forming step, in case of forming the porous layer whose thickness partially varies on the bonding surface of the base substrate,
the bonding surface of the base substrate is subjected to anodic oxidation, and the protective film subjected to the pattern forming is removed.

8. The method for manufacturing a bonded substrate according to claim 1,
wherein a silicon substrate is used as the base substrate and/or the bond substrate.

9. The method for manufacturing a bonded substrate according to claim 2,
wherein a silicon substrate is used as the base substrate and/or the bond substrate.

10. The method for manufacturing a bonded substrate according to claim 3,
wherein a silicon substrate is used as the base substrate and/or the bond substrate.

11. The method for manufacturing a bonded substrate according to claim 4,
wherein a silicon substrate is used as the base substrate and/or the bond substrate.

12. The method for manufacturing a bonded substrate according to claim 1,
wherein, at the insulator film forming step, the insulator film whose thickness partially varies is formed on the bonding surface of the base substrate by changing the porous layer into an oxide film by thermal oxidation.

13. The method for manufacturing a bonded substrate according to claim 2,
wherein, at the insulator film forming step, the insulator film whose thickness partially varies is formed on the bonding surface of the base substrate by changing the porous layer into an oxide film by thermal oxidation.

14. The method for manufacturing a bonded substrate according to claim 3,
wherein, at the insulator film forming step, the insulator film whose thickness partially varies is formed on the bonding surface of the base substrate by changing the porous layer into an oxide film by thermal oxidation.

15. The method for manufacturing a bonded substrate according to claim 4,
wherein, at the insulator film forming step, the insulator film whose thickness partially varies is formed on the bonding surface of the base substrate by changing the porous layer into an oxide film by thermal oxidation.

* * * * *